(12) United States Patent
Dahlstrom et al.

(10) Patent No.: US 12,389,642 B2
(45) Date of Patent: Aug. 12, 2025

(54) SEMICONDUCTOR DEVICES FOR HIGH FREQUENCY APPLICATIONS

(71) Applicant: TEXAS INSTRUMENTS INCORPORATED, Dallas, TX (US)

(72) Inventors: Mattias Dahlstrom, Los Altos, CA (US); Joseph De Santis, Gilroy, CA (US); Jeffrey A. Babcock, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 714 days.

(21) Appl. No.: 17/732,513

(22) Filed: Apr. 29, 2022

(65) Prior Publication Data

US 2023/0352522 A1  Nov. 2, 2023

(51) Int. Cl.
*H10D 62/10* (2025.01)
*H10D 62/815* (2025.01)
*H10D 84/60* (2025.01)

(52) U.S. Cl.
CPC ......... *H10D 62/115* (2025.01); *H10D 62/815* (2025.01); *H10D 84/619* (2025.01)

(58) Field of Classification Search
CPC .............................. H10D 62/115; H10D 62/113
See application file for complete search history.

(56) References Cited

U.S. PATENT DOCUMENTS

| | | |
|---|---|---|
| 7,427,787 B2 | 9/2008 | Steinhoff |
| 8,039,925 B2 | 10/2011 | Wong et al. |
| 8,174,070 B2 | 5/2012 | Mallikarjunaswamy |
| 8,860,139 B2 | 10/2014 | Sawahata |
| 9,117,845 B2 | 8/2015 | Nassar et al. |
| 9,153,569 B1 | 10/2015 | Edwards et al. |
| 9,461,032 B1 | 10/2016 | Edwards |
| 9,831,232 B2 | 11/2017 | Hong et al. |
| 9,929,140 B2 | 3/2018 | Edwards et al. |
| 10,008,616 B2 | 6/2018 | Kim et al. |
| 10,217,733 B2 | 2/2019 | Marreiro et al. |
| 10,269,898 B2 | 4/2019 | Edwards et al. |
| 10,629,723 B2 | 4/2020 | Lin et al. |
| 11,296,075 B2 | 4/2022 | Higgins et al. |
| 2005/0221787 A1 | 10/2005 | Wong et al. |
| 2005/0253216 A1 | 11/2005 | Tsuchiko |
| 2007/0008667 A1 | 1/2007 | Steinhoff |
| 2008/0309394 A1 | 12/2008 | Steinhoff |

(Continued)

*Primary Examiner* — Wasiul Haider
(74) *Attorney, Agent, or Firm* — Yudong Kim; Frank D. Cimino

(57) ABSTRACT

Semiconductor devices for high frequency operations are described. The semiconductor devices include a substrate with an epitaxial layer. The epitaxial layer has higher resistivity than the substrate and includes a surface facing away from the substrate. The epitaxial layer includes a shallow trench isolation (STI) structure extended to a first depth from the surface, which is surrounded by a well structure. Underneath the STI structure, the epitaxial layer includes a lightly doped portion exclusive of dopant atoms of the well structure. Moreover, the STI structure includes an inner portion surrounded by a deep trench isolation structure extended to a second depth from the surface, the second depth being greater than the first depth. An integrated circuit component is located above the inner portion of the STI structure.

41 Claims, 12 Drawing Sheets

(56) References Cited

U.S. PATENT DOCUMENTS

| | | |
|---|---|---|
| 2010/0230719 A1 | 9/2010 | Sawahata |
| 2011/0127602 A1 | 6/2011 | Mallikarjunaswamy |
| 2014/0183622 A1 | 7/2014 | Lin et al. |
| 2014/0213024 A1 | 7/2014 | Nassar et al. |
| 2015/0270256 A1 | 9/2015 | Edwards et al. |
| 2015/0340357 A1 | 11/2015 | Edwards et al. |
| 2015/0340358 A1 | 11/2015 | Edwards et al. |
| 2017/0077082 A1 | 3/2017 | Marrero et al. |
| 2017/0098644 A1 | 4/2017 | Hong et al. |
| 2017/0373199 A1 | 12/2017 | Kim et al. |
| 2019/0035777 A1* | 1/2019 | Ohtake .................. H01L 23/60 |
| 2022/0238631 A1* | 7/2022 | Zierak ............... H01L 21/76283 |

* cited by examiner

SEMICONDUCTOR DEVICES FOR HIGH FREQUENCY APPLICATIONS

TECHNICAL FIELD

The present disclosure generally relates to the field of semiconductor devices, and more particularly to semiconductor devices for high frequency applications.

BACKGROUND

Integrated circuits (ICs) include various components fabricated on a semiconductor substrate, such as transistors, resistors, capacitors, among others. The ICs can be designed to operate at the radio frequency (RF) range varying from 20 kHz to 300 GHz. For example, systems supporting millimeter wave (MM wave) applications may include the ICs to handle signal frequencies greater than 10 GHz or so. Such high frequency operations may benefit from the components of the ICs having predictable characteristics and low leakage to the semiconductor substrate over the ranges of operating frequencies.

SUMMARY

The present disclosure describes semiconductor devices that may be beneficially applied to manufacturing ICs with improved high frequency characteristics. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a semiconductor device includes a semiconductor layer over a substrate, the semiconductor layer including a surface opposite to the substrate; a well structure within the semiconductor layer, the well structure including first and second well portions laterally spaced apart from each other along the surface; a shallow trench isolation (STI) structure located between the first and second well portions, the STI structure extended to a first depth with respect to the surface; a component over the STI structure, the component having a footprint between the first and second well portions, where: a first edge of the footprint faces the first well portion; and a second edge of the footprint faces the second well portion. The semiconductor device may also include a deep trench isolation (DTI) structure located between the first and second well portions, the DTI structure extended to a second depth with respect to the surface, the second depth being greater than the first depth, where: a first portion of the DTI structure is located between the first edge of the footprint and the first well portion, and a second portion of the DTI structure is located between the second edge of the footprint and the second well portion.

In some embodiments, a semiconductor device includes a shallow trench isolation (STI) region of an epitaxial layer, the STI region including a deep trench isolation (DTI) region, where: the STI region includes an inner portion inside the DTI region; the STI region includes a first dielectric isolation structure with a first thickness with respect to a surface of the epitaxial layer; and the DTI region includes a second dielectric isolation structure with a second thickness with respect to the surface greater than the first thickness. The semiconductor device also includes a well region of the epitaxial layer surrounding the STI region, the well region having a greater dopant concentration than the epitaxial layer; and a component having a footprint located within the inner portion of the STI region.

In some embodiments, a semiconductor device includes a first semiconductor layer over a second semiconductor layer, the first semiconductor layer having a surface facing away from the second semiconductor layer. The device also includes a doped structure within the first semiconductor layer, the doped structure including first and second doped portions that are laterally spaced apart from each other along the surface; a first isolation structure located between the first and second doped portions, the first isolation structure extended to a first depth from the surface; and an integrated circuit (IC) component over the first isolation structure, the IC component having a footprint between the first and second doped portions.

DETAILED DESCRIPTION

Figure 1A:
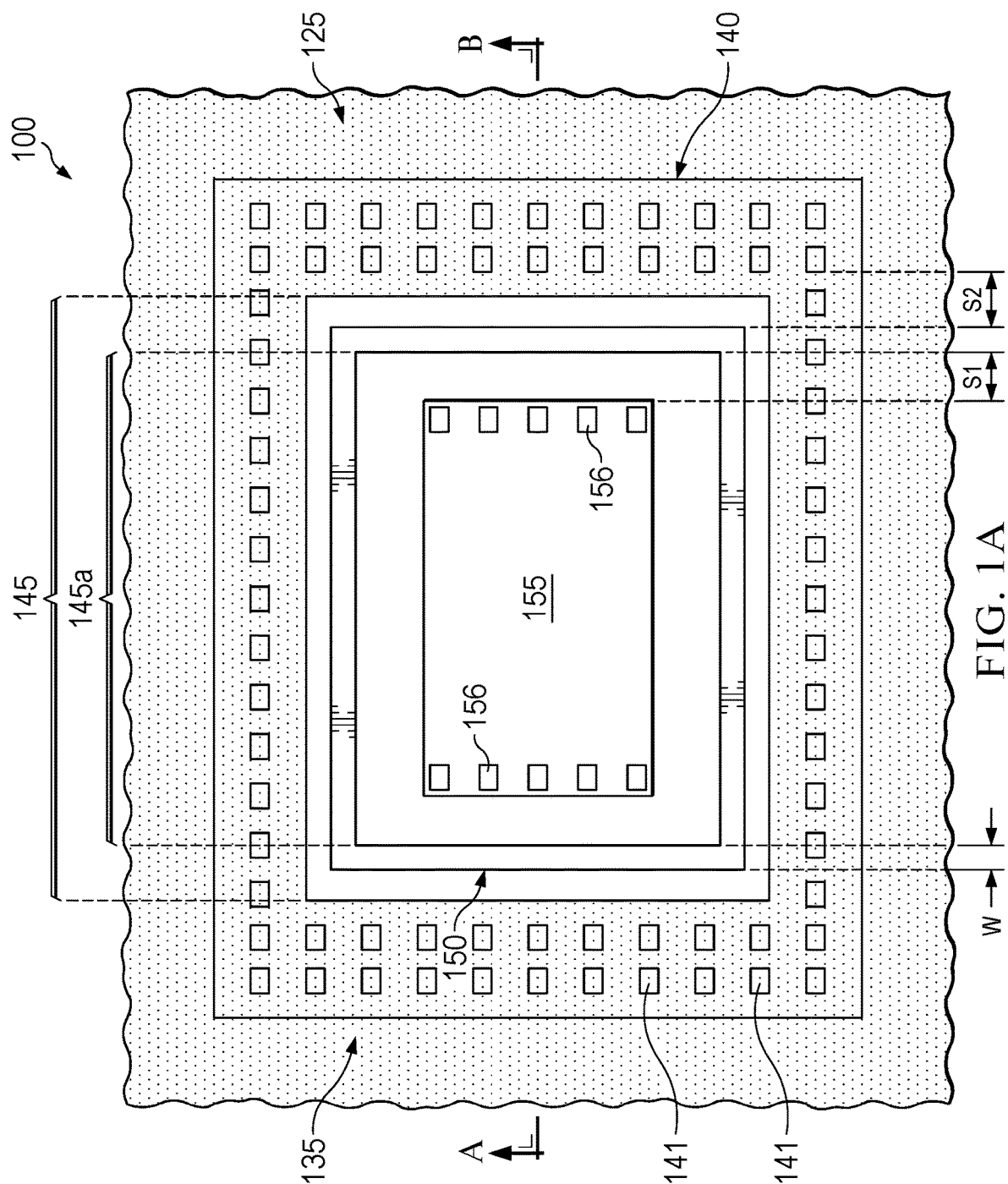
FIGS. 1A through 1C illustrate schematic diagrams of a semiconductor device in plan and cross-sectional views in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. It is to be understood that the figures and examples are not meant to limit the scope of the present disclosure to such example embodiments, but other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

Various structures disclosed herein can be formed using semiconductor process techniques. Layers including a variety of materials can be formed over a substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

The semiconductor devices, integrated circuits, or IC components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. The conductivity (or resistivity) of the substrate (or regions of the substrate) can be controlled by doping techniques using various chemical species (which may also be referred to as dopant atoms) including, but not limited to, boron, indium, arsenic, or phosphorus. Doping may be performed during the initial formation or growth of the substrate (or an epitaxial layer grown on the substrate), by ion-implantation, or other suitable doping techniques.

As used herein, terms such as "first" and "second" are used to arbitrarily distinguish between the elements such terms describe. Thus, these terms in the description and in the claims are not intended to indicate temporal or other prioritization of such elements. Moreover, terms such as "front," "back," "top," "bottom," "over," "under," "vertical," "horizontal," "lateral," "down," "up," "upper," "lower," or the like, are used to refer to relative directions or positions of features in the semiconductor devices in view of the orientation shown in the figures. For example, "upper" or "uppermost" can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein.

It would be beneficial for components of the ICs operating at the RF and millimeter wave frequencies (e.g., frequencies in several GHz ranges or higher) to have predictable electrical characteristics and low leakage of the RF signals to the substrate (which may be referred to as RF leakage). Such IC components may include passive components (e.g., resistors, capacitors) and/or active components (e.g., transistors, thin-film transistors). Certain IC components (e.g., thin-film resistors) can be formed in the backend of the process line (e.g., the metal 1 (MT1) level or higher) to mitigate coupling of the RF signals to the substrate based on the distance between the IC components and the substrate.

Thin-film resistors may be formed using backend conductive materials, such as aluminum or copper, or using materials devised for fabricating the resistors (e.g., NiCr, SiCr, TaN). Such thin-film resistors tend to add cost and complexity to the ICs. For example, the thin-film resistors may occupy large areas due to low resistivity and/or poor electromigration performance of the materials. The thin-film resistors can also be formed using polycrystalline silicon (e.g., poly-silicon resistors, poly resistors) in a field region of the substrate, which is a material widely used in the semiconductor fabrication process. For example, poly-silicon can be used to form gate structures of metal-oxide-semiconductor (MOS) field effect transistors (FETs) or to form emitter or base structures of bipolar junction transistors (BJTs). Moreover, poly-silicon can be easily modified to provide a wide range of resistivity—e.g., by controlling density of n-type and/or p-type dopant atoms in the poly-silicon, by forming a conductive layer on the poly-silicon, such as W, WSix, TiSix, or NiSix.

The field region generally refers to a dielectric isolation region including field oxide formed over the substrate. The field oxide can be formed by shallow-trench isolation (STI) techniques or local oxidation of silicon (LOCOS) techniques. It is common practice to dope the substrate (e.g., adding dopant atoms) under the field oxide to reduce resistivity of the substrate. Reducing the resistivity of the substrate in the field region is helpful to avoid risks associated with undesirable parasitic operations—e.g., triggering latch-up phenomena, turning on field FETs—that are detrimental to the reliability of ICs. Ion-implantation techniques can be used to add the dopant atoms, and the portions of the substrate implanted with dopant atoms may be referred to as well regions, for example, n-well regions including n-type dopant atoms (e.g., phosphorus, arsenic), p-well regions including p-type dopant atoms (e.g., boron, indium).

When the IC components formed in the field region (e.g., thin-film resistors) operate at high frequencies, the small signal characteristics of the IC components may deviate from their low frequency characteristics due to the RF leakage. For example, small signal resistance values of the thin-film resistors may significantly increase at several GHz range when compared to their low-frequency values. The increased conductivity (and/or increased capacitance) of the well regions under the field oxide is expected to exacerbate such RF leakage to the substrate.

The present disclosure describes semiconductor devices for high frequency operations. Such semiconductor devices include IC components and are expected to have reduced RF leakage at least partially due to increased resistivity and/or decreased capacitance of the resistance-capacitance (RC) network between the IC components and the substrate. As described in more detail below, the semiconductor devices comprise a substrate including a first semiconductor layer (e.g., an epitaxial layer) over a second semiconductor layer, the first semiconductor layer having a surface facing away from the second semiconductor layer. The first semiconductor layer includes a first dielectric isolation structure (e.g., an STI structure, a LOCOS structure) extended to a first depth from the surface, which is surrounded by a doped region (e.g., a well region) of the first semiconductor layer. From a cross-sectional viewpoint, the first dielectric isolation structure is located between first and second doped portions of the doped region laterally spaced apart from each other along the surface. The first semiconductor layer has first resistivity greater than second resistivity of the second semiconductor layer. The doped region has third resistivity that is less than the first resistivity and greater than the second resistivity.

Underneath the first dielectric isolation structure, the first semiconductor layer includes a lightly doped portion exclusive of dopant atoms that form the doped region. For example, dopant atoms forming the well region (e.g., well implants) are blocked from entering the lightly doped portion. In some embodiments, compensating implants can be used to increase the resistivity of the lightly doped portion. Moreover, the first dielectric isolation structure includes an inner portion surrounded by a second dielectric isolation structure (e.g., a deep trench isolation (DTI) structure) extended deeper into the substrate than the first dielectric isolation structure. The semiconductor devices include an integrated circuit (IC) component located above the inner portion of the STI structure. As such, the IC component has a footprint within the inner portion of the STI structure. Moreover, a width of the entire portion of the first semiconductor layer corresponding to the inner portion of the STI structure (e.g., the first semiconductor layer surrounded by the DTI structure) that includes the footprint of the IC component is the lightly doped region. From a cross-sectional viewpoint, a first portion of the second dielectric isolation structure is located between a first edge of the footprint and the first doped portion, and a second portion of the second dielectric isolation structure is located between a second edge of the footprint and the second doped portion.

In conjunction with the lightly doped portion of the first semiconductor layer under the IC component, the second dielectric isolation structure (e.g., DTI structure) surrounding the footprint of the IC components is expected to reduce the RF leakage. In some embodiments, the substrate includes a buried oxide layer between the first and second semiconductor layers, which may also be referred to as a silicon-on-insulator (SOI) substrate. The buried oxide layer can further reduce the RF leakage to the substrate. In such embodiments, the DTI structure extends to the buried oxide layer to provide complete dielectric isolation of the lightly doped portion, over which the IC component is located. The IC component may include passive components (e.g., resistors, capacitors) and/or active components (e.g., thin-film transistors) that can be formed over the first dielectric isolation structure. In some embodiments, the passive components may be formed higher in the back end of the line metallization stack, such as a thin-film resistor (TFR) or a metal-insulator-metal capacitor (MIMCAP).

Figure 1B:
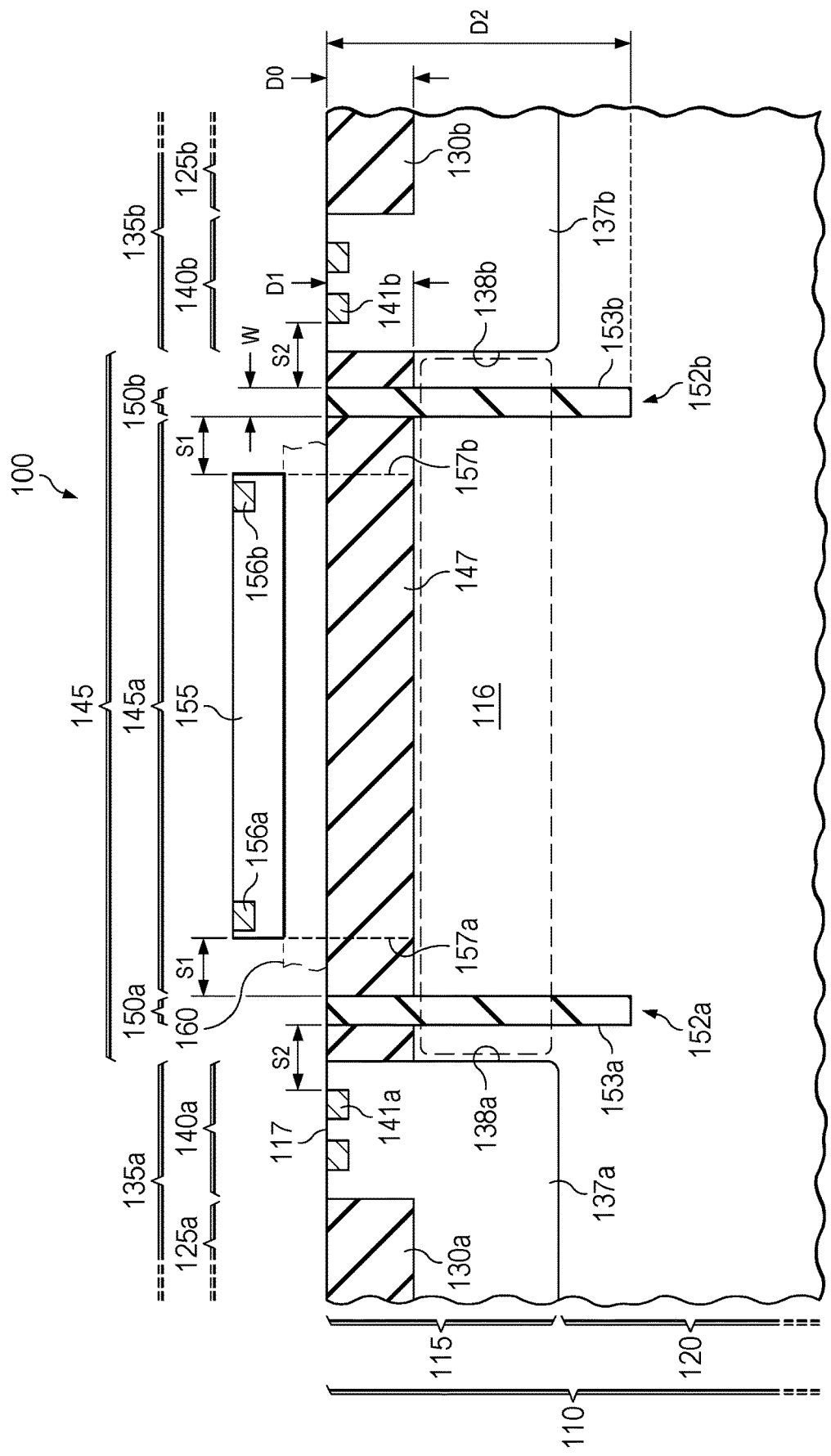
Figure 1C:
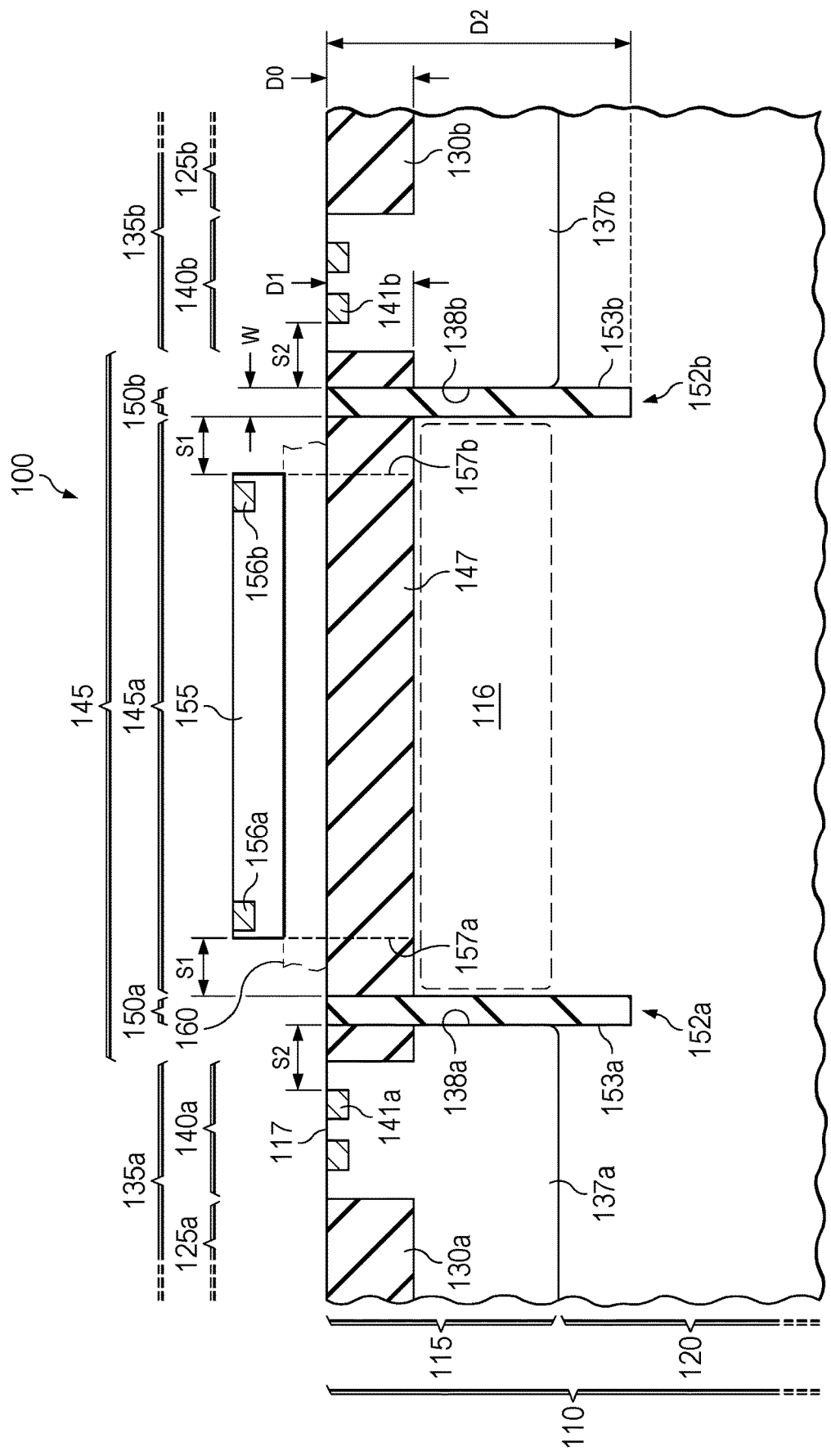

FIGS. 1A through 1C illustrate schematic diagrams of a semiconductor device 100 in plan and cross-sectional views in accordance with embodiments of the present disclosure. FIG. 1A is a plan view of the semiconductor device 100, which may be regarded as a composite layout of the semiconductor device 100, and FIGS. 1B and 1C are cross-sectional views of the semiconductor device 100 taken across an imaginary line AB as marked in FIG. 1A. These figures are described concurrently in the following discussion.

The semiconductor device 100 includes a substrate 110 having a first semiconductor layer 115 and a second semiconductor layer 120 as shown in FIGS. 1B/1C. The first semiconductor layer 115 includes a surface (e.g., a top surface) 117 that faces away from the second semiconductor layer 120. In some embodiments, the second semiconductor layer 120 can be doped (with either n-type or p-type dopant atoms) to adequately provide a ground plane (or a ground node) for the semiconductor device 100 (and/or other ICs fabricated on the substrate 110) during operation.

The first semiconductor layer 115 may include relatively low density of dopant atoms (e.g., dopant density ranging between about $10^{14}$ cm$^{-3}$ to $10^{16}$ cm$^{-3}$). Such low density of dopant atoms in the first semiconductor layer 115 facilitates forming various semiconductor devices and/or circuits using the first semiconductor layer 115, such as p-well regions, n-type MOS transistors in the p-well regions, n-well regions, p-type MOS transistors in n-well regions, or the like. As such, the first semiconductor layer 115 may be referred to as a lightly doped semiconductor layer, which may be of n-type or p-type.

In some embodiments, the first semiconductor layer 115 is an epitaxial layer grown on an underlying layer (or an underlying substrate). As such, the first semiconductor layer 115 may also be referred to as an epi layer or an epitaxial layer. For example, the first semiconductor layer 115 is a lightly doped p-type epitaxial layer. Further, the second semiconductor layer 120 may be referred to as a semiconductor substrate, on which the epitaxial layer 115 is grown. While the first and second semiconductor layers 115 and 120 may be of any type, for example, silicon, germanium, silicon-germanium alloy, or gallium arsenide, the present disclosure is not limited to any particular type.

Also illustrated in FIG. 1A is a field region 125 (also identified individually as field regions 125a/b in FIGS. 1B/1C). The field region 125 include field oxide 130 (also identified individually as 130a/b in FIGS. 1B/1C). The field oxide 130 can be formed using STI techniques or LOCOS techniques. The field oxide 130 may extend to a depth (DO as denoted in FIGS. 1B/1C) from the surface 117 of the first semiconductor layer 115. In some embodiments, the depth is less than 1 micron (μm). For example, the depth may vary between 0.15 to 0.6 μm.

Also illustrated in FIG. 1A is a well region 135 (denoted as a dotted area overlapping the field region 125 and the active region 140), which is also identified individually as well regions 135a/b in FIGS. 1B/1C. The well region 135 include well structures 137 (identified individually as well structures 137a/b in FIGS. 1B/1C). The well structures 137 (which may also be referred to as well portions) can be formed by suitable doping techniques that introduce dopant atoms to selected portions of the first semiconductor layer 115 (e.g., the well region 135). As such, the well region 135 may be referred to as a doped region. Similarly, the well structures 137 may be referred to as doped structures.

The well structures 137 can be formed by using ion implantation techniques in combination with photolithography techniques. During the ion implantation process, a photoresist layer can be patterned to open the well region 135. For example, the field region 125 and the active region 140 are open during the ion implantation process to receive the dopant atoms. An annealing process typically follows the ion implantation process to activate the implanted dopant atoms. Moreover, the annealing process may spread the dopant atoms (e.g., through diffusion process) with respect to the as-implanted dopant distribution profiles. The well structures 137 may include medium density of dopant atoms (e.g., dopant density ranging between $10^{16}$ cm$^{-3}$ to $10^{18}$ cm$^{-3}$). In some embodiments, the well structures 137 have sheet resistance varying between about 500 Ohms/square (Ω/☐) and 2,000 Ω/☐.

The well structures 137 reduces resistivity of the first semiconductor layer 115 to mitigate risks associated with undesirable parasitic operations—e.g., triggering latch-up (by activating parasitic bipolar transistors) phenomena, turning on field devices (which may also be referred to as field FETs). Such parasitic operations tend to be detrimental to the reliability of ICs. Accordingly, it is common practice to form doped regions in substantially the entire surface of the first semiconductor layer 115. Moreover, the well structures 137 may provide low resistance paths to the second semiconductor layer 120 from the surface of the first semiconductor layer 115. As such, the well structures 137 may be configured to connect to the second semiconductor layer 120 as depicted in FIGS. 1B/1C—e.g., by selecting appropriate implant energy during the ion implantation process and annealing conditions.

Also illustrated in FIG. 1A is an active region 140 (also identified individually as active regions 140a/b in FIGS. 1B/1C). The active region 140 may be regarded as a portion of the first semiconductor layer 115 absent the field oxide 130 (or the first isolation structure 147 described below). Various semiconductor devices or circuit components (e.g., transistors, contacts) can be fabricated in active regions. The active region 140 includes contacts 141 (also identified individually as 141a/b in FIGS. 1B/1C). The contacts 141 are electrically connected to (e.g., coupled with) the second semiconductor layer 120 through the well structures 137 such that contacts 141 can provide a ground potential to the second semiconductor layer 120 from the surface 117 during operation. Accordingly, the contacts 141 may be referred to as substrate contacts, substrate taps, or ground taps. Further, the contacts 141 can be arranged to form a ring (e.g., as a ground ring surrounding the first isolation region 145) acting as a noise suppression region that absorbs (blocks) high frequency and/or low frequency electrical energy.

Also illustrated in FIG. 1A is a first isolation region 145. The first isolation region 145 is surrounded by the well region 135. The first isolation region 145 includes a first isolation structure 147 (which may also be referred to as a first dielectric isolation structure) as shown in FIGS. 1B/1C. The first isolation structure 147 extend to a first depth (D1 as denoted in FIGS. 1B/1C) from the surface 117 of the first semiconductor layer 115. In some embodiments, the first isolation structure 147 is formed concurrently with the field oxide 130 of the field regions 125. As such, the first isolation structure 147 may include the field oxide 130 and extend to the same depth as the field oxide 130—i.e., D1 being equal to D0. In other embodiments, the first isolation structure 147 extends to a different depth than the field oxide—i.e., D1 being different than D0.

For example, during the STI process, trenches for both the first isolation region 145 and the field region 125 can be formed in the first semiconductor layer 115. Subsequently, a masking layer can be used to selectively open the trench corresponding to the first isolation region 145 (while protecting the field region 125) such that additional etch process steps can make the trench corresponding to the first isolation region 145 deeper into the first semiconductor layer 115. An alternative masking scheme (e.g., selectively opening the field region 125 while protecting the first isolation region 145) can be used such that the first isolation region 145 can have a shallower trench depth than the field region 125. In this manner, upon completing the STI process, the first isolation structure 147 may extend to a different depth from the surface 117 than the field oxide 130.

Similarly, a first LOCOS process can be performed to partially form the first isolation structure 147 (e.g., forming field oxide of a first thickness) without forming the field oxide 130 in the field region 125. Subsequently, the field region 125 can be defined using a mask such that the field oxide 130 can be formed during a second LOCOS process after the first LOCOS process. As a result of the second LOCOS process, the field oxide corresponding to the first isolation structure 147 grows thicker than the field oxide 130 of the field region 125 due to the field oxide of the first thickness already present in the first isolation region 145. An alternative masking scheme can be used (e.g., partially growing the field oxide 130 in the field region 125 without defining the first isolation region 145) such that the first isolation region 145 can have a thinner field oxide than the field region 125. In this manner, upon completing the LOCOS process, the first isolation structure 147 may extend to a different depth from the surface 117 than the field oxide 130.

Also illustrated in FIG. 1A is a second isolation region 150 inside of the first isolation region 145. The second isolation region 150 includes second isolation structures 152 (which may also be referred to as second dielectric isolation structures) that are also identified individually as second isolation structures 152a/b in FIGS. 1B/1C. The second isolation region 150 overlaps (superimposes) the first isolation region 145. The second isolation region 150 depicted in FIG. 1A forms a closed rectangular loop. As such, the first isolation region 145 has an inner portion 145a inside the second isolation region 150. In other words, the inner portion 145a of the first isolation region 145 is surrounded by the second isolation region 150. The second isolation structures 152 extend to a second depth (D2 as denoted in FIGS. 1B/1C) from the surface 117. The second depth (D2) is greater than the first depth (D1) of the first isolation structure 147.

In some embodiments, the second depth is greater than 1 μm and less than 20 μm. Further, the width (W as denoted in FIGS. 1A and 1B/1C) of the second isolation structures 152 may vary between 0.5 μm to several microns (e.g., 2 to 3 μm). In some embodiments, the second isolation structures 152 can be formed by deep trench isolation (DTI) techniques. As such, the second isolation region 150 may be referred to as a DTI region. Similarly, the second isolation structures 152 may be referred to as DTI structures. In some embodiments, the DTI structures may include poly-silicon, where the poly-silicon is dielectrically isolated from other structures (or components) outside the DTI structures.

Although the second isolation region 150 depicted in FIG. 1A forms a closed rectangular loop, the present disclosure is not limited thereto. For example, the second isolation region 150 may form a circle, an ellipse, an obround, or any closed polygon shapes. Moreover, although the second isolation structures 152 depicted in FIGS. 1B/1C extend deeper than the first semiconductor layer 115 (or the depth of the well structures 137), the present disclosure is not limited thereto. For example, the second isolation structures 152 may extend to the interface between the first and second semiconductor layers 115 and 120 (or about the same depth as the well structures 137). In other examples, the second isolation structures 152 may not reach the interface between the first and second semiconductor layers 115 and 120 (or extend less than the depth of the well structures 137).

As illustrated in FIGS. 1A and 1B/1C, the well region 135 borders the first isolation region 145. As a result, the well implants forming the well structures 137 are blocked from entering the first isolation region 145. For example, a resist layer covering the first isolation region 145 blocks the well implants for the first isolation region 145. Accordingly, the first isolation region 145 may correspond to a well-implant block pattern designed to prohibit the well implants from entering into the first isolation region 145. pattern.

In other embodiments, the first isolation region 145 may include a portion (e.g., peripheral portions along its boundary) that overlaps with the well region 135. As such, the portion of the first isolation region 145 may receive the well implants. Nonetheless, the overlap between the first isolation region 145 and the well region 135 (e.g., by design or by process variations) may be prohibited from encroaching into the inner portion 145a of the first isolation region 145 such that the inner portion 145a remains free of the well implants.

Also illustrated in FIG. 1B is a lightly doped portion 116 of the first semiconductor layer 115. The lightly doped portion 116 extends between the well structures 137a and 137b underneath the first isolation structure 147. In this regard, the lightly doped portion 116 directly contacts (e.g., touches) the first isolation structure 147. Although FIG. 1B depicts the lightly doped portion 116 as a separate box-like feature of the first semiconductor layer 115 for illustration purposes, the lightly doped portion 116 may be regarded as part of the first semiconductor layer 115 under the first isolation structure 147 absent (exclusive of) the dopant atoms of the well structures 137a and 137b. In other words, lack of the well implants in the first semiconductor layer 115 under the first isolation structure 147 may define the lightly doped portion 116. In this regard, the lightly doped portion 116 may correspond to the well-implant block pattern. As such, the lightly doped portion 116 has higher resistivity than the well structures 137a and 137b.

In some embodiments, the lightly doped portion 116 has the same resistivity as the first semiconductor layer 115. In some embodiments, compensating implants can be done to increase the resistivity of the lightly doped portion 116—e.g., the lightly doped portion 116 having greater resistivity than the first semiconductor layer 115. Compensating implants refer to adding dopant atoms of an opposite conductivity type to a semiconductor structure, which may be referred to as counter-doping. For example, if the lightly doped portion 116 includes p-type dopant atoms (e.g., the first semiconductor layer 115 being a p-type epitaxial layer), n-type dopant atoms can be introduced to the lightly doped portion 116 to increase resistivity of the lightly doped portion 116. The lightly doped portion 116 may have sheet resistance greater than 10,000Ω/□. For example, the sheet resistance of the lightly doped portion 116 corresponds to 30,000 Ω/□.

In some embodiments, the well structures 137a/b may laterally reach the second isolation structures 152a/b underneath the first isolation structure 147 as shown in FIG. 1C. For example, during the annealing process that activates the implanted dopant atoms, the implanted dopant atoms spread (or diffuse) laterally to the outer perimeter of the second isolation region 150. In other words, the outer sidewalls 153a/b of the DTI structures 152a/b may be in contact with the sidewalls 138a/b of the well structures 137a/b, respectively. In such embodiments, the lightly doped portion 116 extends between the DTI structures 152a and 152b. In other words, the lightly doped portion 116 may correspond to the inner portion 145a of the first isolation region 145 inside the second isolation region 150. In this regard, the DTI structures 152a/b are expected to provide dielectric barriers against spreading of the well regions to maintain the lightly doped portion 116 free of the dopant atoms of the well implants.

In some embodiments, the lightly doped portion 116 may be regarded as a portion of the first semiconductor layer 115, which has resistivity that is equal to or greater than that of as-formed first semiconductor layer 115 (e.g., as-grown p-type epitaxial layer). As such, the lightly doped portion 116 may include only the dopant atoms incorporated in the first semiconductor layer 115 while the first semiconductor layer 115 is formed (e.g., during the epitaxy process steps) and/or the dopant atoms added thereafter to increase its resistivity (e.g., dopant atoms of compensating implants). In other words, the lightly doped portion 116 may not include dopant atoms added to the first semiconductor layer 115 to reduce its resistivity (e.g., dopant atoms of the well implants or of implant steps forming other components). For example, as shown in FIGS. 1B/1C, no well regions are formed between the second isolation structures (e.g., DTI structures).

Also illustrated in FIGS. 1A and 1B/1C is an IC component 155, which is located over the first isolation structure 147. The IC component 155 may be a resistor (e.g., a poly resistor or a thin-film resistor), a capacitor, a thin-film transistor, or a combination thereof. In some embodiments, the IC component 155 is a passive component (a resistor, a capacitor) including two terminals and contacts 156a/b for the two terminals. In some embodiments, the IC component 155 is directly on the first isolation structure 147. In other embodiments, the IC component 155 is directly on an optional dielectric structure 160 (drawn with a dotted line in FIGS. 1B/1C) disposed between the IC component 155 and the first isolation structure 147. The optional dielectric structure 160 may include contacts, vias, or conductive traces (not explicitly shown in FIGS. 1B/1C).

The IC component 155 has a footprint between the first and second well structures 137a/b as shown in FIGS. 1B/1C. Moreover, the footprint is located within the inner portion 145a of the first isolation region 145. A first edge 157a of the footprint faces the well structure 137a, and a second edge 157b of the footprint faces the well structure 137b. Further, the DTI structure 152a is located between the first edge 157a of the footprint and the well structure 137a, and the DTI structure 152b is located between the second edge 157b of the footprint and the well structure 137b. In this manner, the DTI structures 152a/b (or the DTI region 150 as shown in FIG. 1A) surrounds at least a portion of the lightly doped portion 116 of the first semiconductor layer 115, above which the IC component 155 is located. In some embodiments, a distance (S1 as denoted in FIGS. 1A and 1B/1C) between the first (or second) edge of the footprint and the DTI structure 152a (or the DTI structure 152b) ranges between one (1) to ten (10) microns.

Although FIG. 1A illustrates multiple individual substrate contacts 141 (and the active region 140 including the contacts 141) surrounding the first isolation region 145, the present disclosure is not limited thereto. For example, the substrate contacts 141 can be a ring structure (e.g., a ground ring) surrounding the first isolation region 145 as described above. In other examples, one or more individual substrate contacts 141 (and corresponding active regions 140 and the well regions 135) can be placed next to the first isolation region 145. In some embodiments, the one or more individual substrate contacts 141 are part of the substrate taps distributed in the field region 125 to provide a robust ground plane during the operation. In some embodiments, a distance (S2 as denoted in FIGS. 1A and 1B/1C) between the DTI structure 152a (or 152b) and the nearest one of the one or more contacts 141 thereto is less than fifty (50) microns.

Figure 2A:
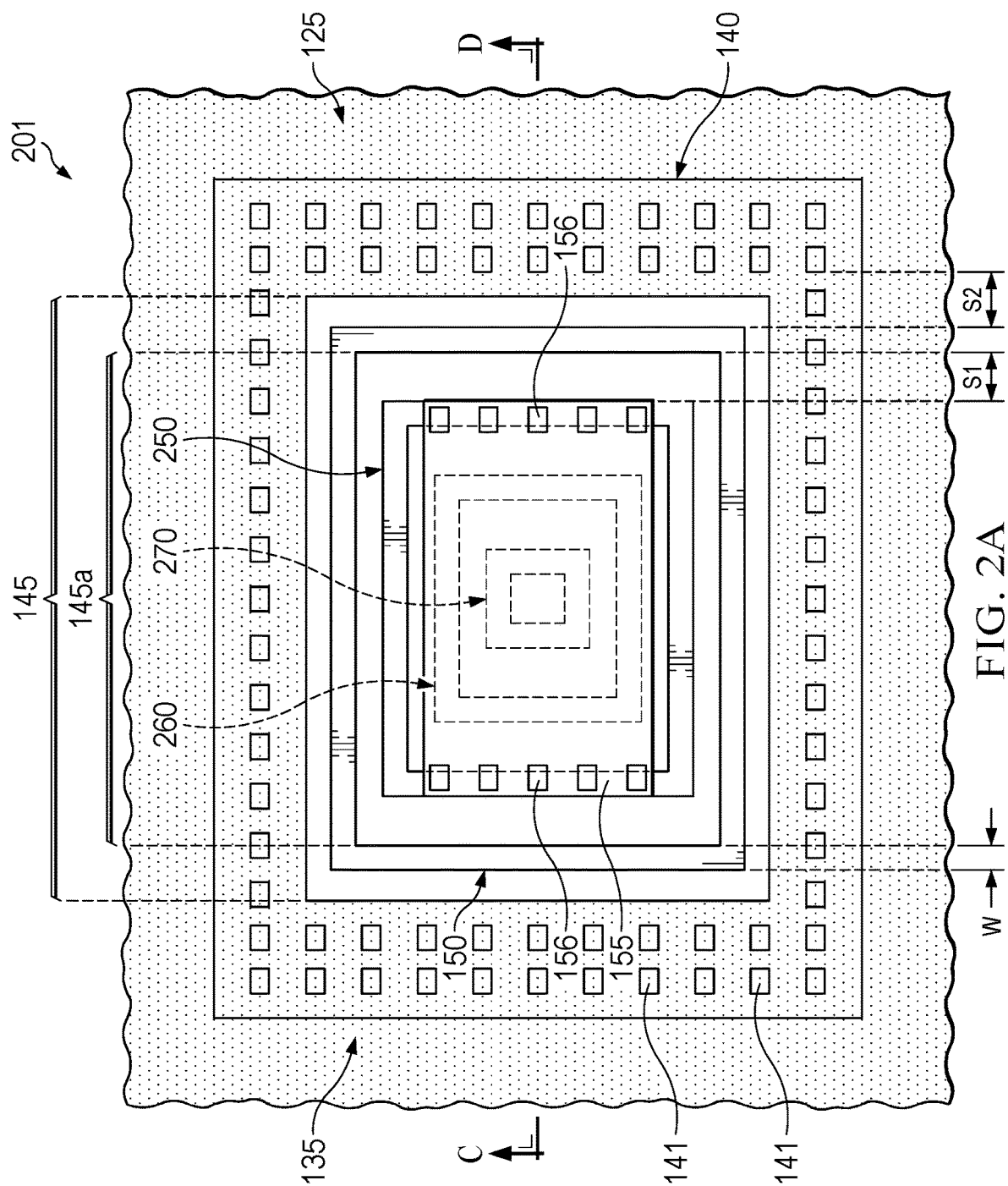
FIGS. 2A through 2C illustrate schematic diagrams of semiconductor devices in plan and cross-sectional views in accordance with embodiments of the present disclosure.
Figure 2B:
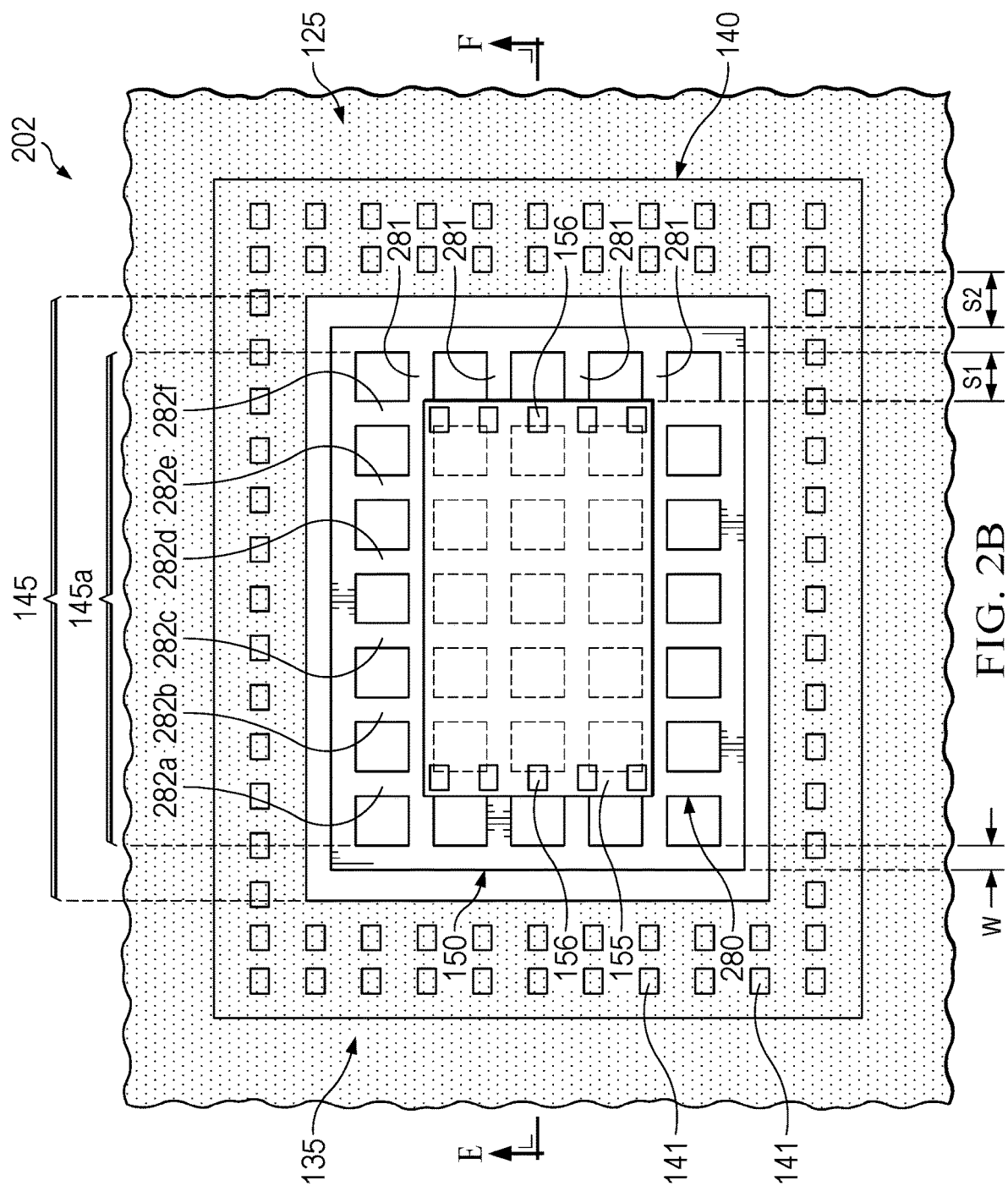
Figure 2C:
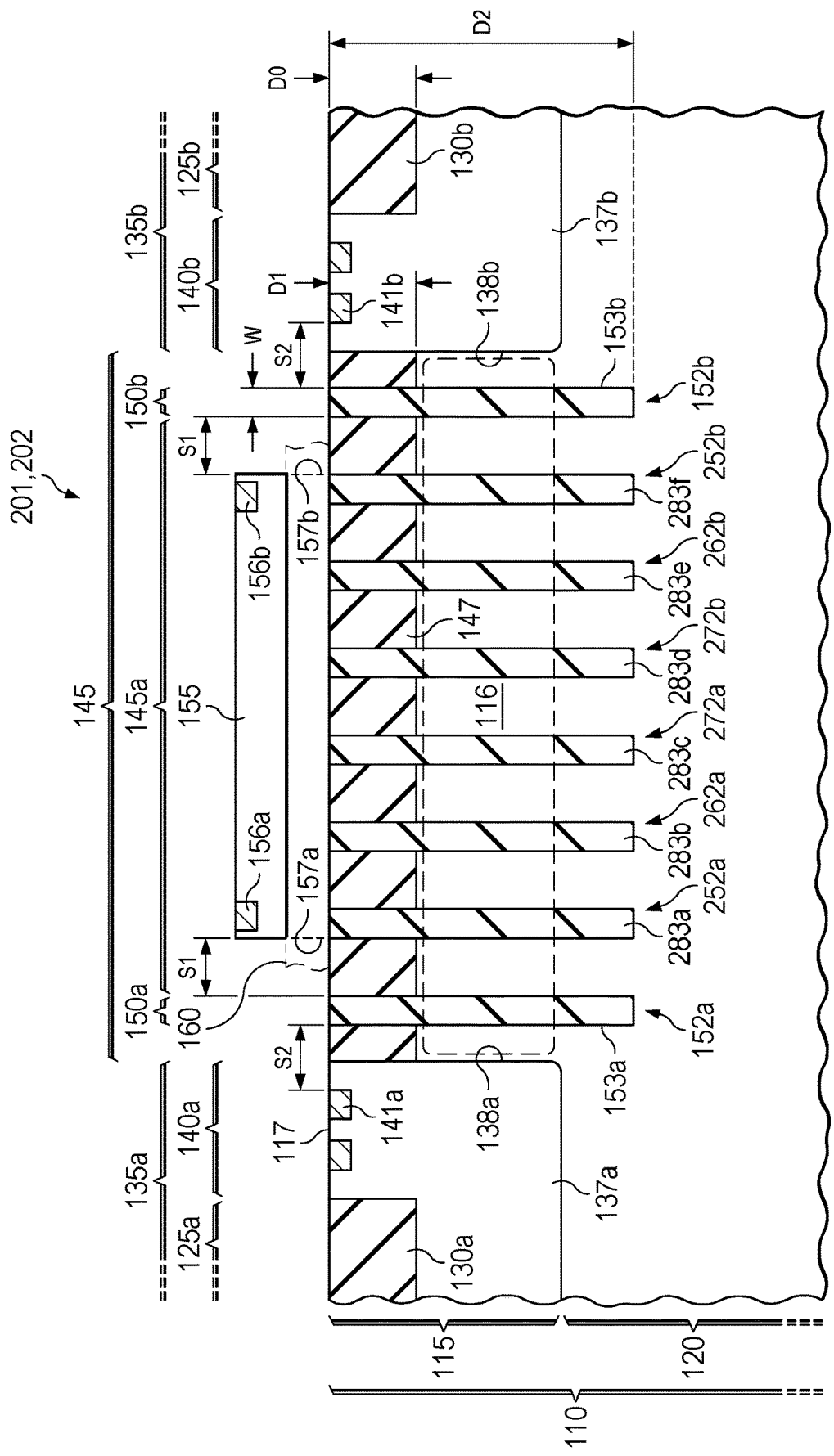

FIGS. 2A through 2C illustrate schematic diagrams of semiconductor devices 201 and 202 in plan and cross-sectional views in accordance with embodiments of the present disclosure. FIG. 2A is a plan view of the semiconductor device 201, which may be regarded as a composite layout of the semiconductor device 201, and FIG. 2C is a cross-sectional view of the semiconductor device 201 taken across an imaginary line CD as marked in FIG. 2A. Similarly, FIG. 2B is a plan view of the semiconductor device 202, which may be regarded as a composite layout of the semiconductor device 202, and FIG. 2C is a cross-sectional view of the semiconductor device 202 taken across an imaginary line EF as marked in FIG. 2B. The semiconductor devices 201 and 202 can be considered as having a modified layout of the second isolation region 150 of the semiconductor device 100 to further enhance the high frequency characteristics—e.g., reducing the RF leakage of the IC component 155. These figures are described concurrently in the following discussion.

The embodiments illustrated in FIGS. 2A through 2C are generally similar to the embodiments illustrated in FIGS. 1A and 1B/1C, and therefore like reference numbers refer to like components or features of FIGS. 1A and 1B/1C. For example, the semiconductor devices 201 and 202 includes the substrate 110 having the first semiconductor layer 115 and the second semiconductor layer 120. Moreover, both of the semiconductor devices 201 and 202 include the field region 125, the active region 140 including substrate contacts 141, the well region 135 including the well structures 137, the first isolation region 145 including the first isolation structure 147, the second isolation region 150 including the second isolation structures 152, the lightly doped portion 116 of the first semiconductor layer 115, and the IC component 155.

FIG. 2A illustrates the semiconductor device 201 including second isolation regions 250, 260, and 270, in addition to the second isolation region 150. The additional second isolation regions 250, 260, and 270 overlap with (superimpose) the first isolation region 145. In some embodiments, the layout of the second isolation region 150 described with reference to FIG. 1A can be modified to include the additional second isolation regions 250, 260, and 270. As such, additional second isolation structures 252, 262, and 272 (also identified individually as second isolation structures 252a/b, 262a/b, and 272a/b in FIG. 2C) can be concurrently formed with the second isolation structures 152, and have the same physical characteristics/dimensions as the second isolation structures 152.

In this regard, the second isolation region 150 corresponds to the outermost one of the multiple second isolation regions (e.g., the second isolation regions 150, 250, 260, and 270), and the multiple second isolation regions 150, 250, 260, and 270 form a series of concentric rectangular closed loops. Moreover, the footprint of the IC component 155 at least partially overlaps with one or more of the multiple second isolation regions. Although the semiconductor device 201 is depicted to include four (4) second isolation regions 150, 250, 260, and 270, which form a series of concentric closed rectangular loops, the present disclosure is not limited thereto. For example, the multiple second isolation regions 150, 250, 260, and 270 may not have the same center. Additionally, or alternatively, the semiconductor device 201 can have less (e.g., three, two) or greater (five, six, even more) quantities of second isolation regions.

FIG. 2B illustrates the semiconductor device 202 including a mesh 280 of second isolation regions (which may also be referred to as a DTI mesh), where the second isolation region 150 corresponds to the outermost rim of the DTI mesh 280. The DTI mesh 280 includes, in addition to the second isolation region 150, multiple segments of second isolation regions (e.g., DTI segments) that intersect with each other. For example, horizontal segments 281 of second isolation regions intersect with vertical segments 282 (also identified individually as vertical segments 282a-f) of second isolation regions to form an inner portion of the DTI mesh 280, which is surrounded by the second isolation region 150. In some embodiments, the layout of the second isolation region 150 described with reference to FIG. 1A can be modified to include the horizontal and vertical segments 281 and 282 of the second isolation regions. As such, the second isolation structures (e.g., the second isolation structures 283a-f in FIG. 2C) corresponding to the inner portion of the DTI mesh 280 can be concurrently formed with the second isolation structures 152a/b, and have the same physical characteristics as the second isolation structures 152a/b. Moreover, the footprint of the IC component 155 at least partially overlaps the DTI mesh 280.

Figure 3A:
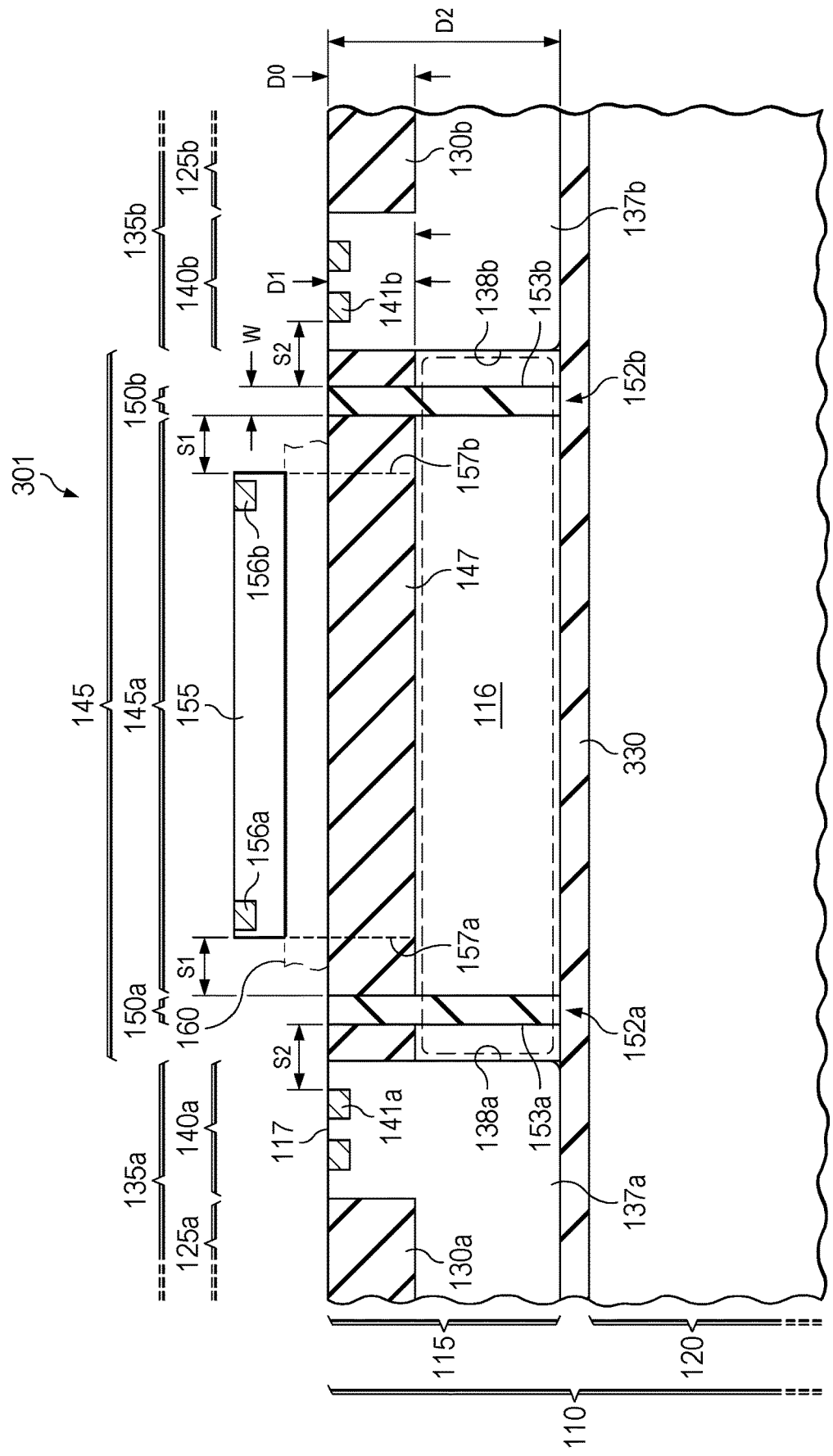
FIGS. 3A and 3B illustrate cross-sectional schematic diagrams of semiconductor devices in accordance with embodiments of the present disclosure.
Figure 3B:
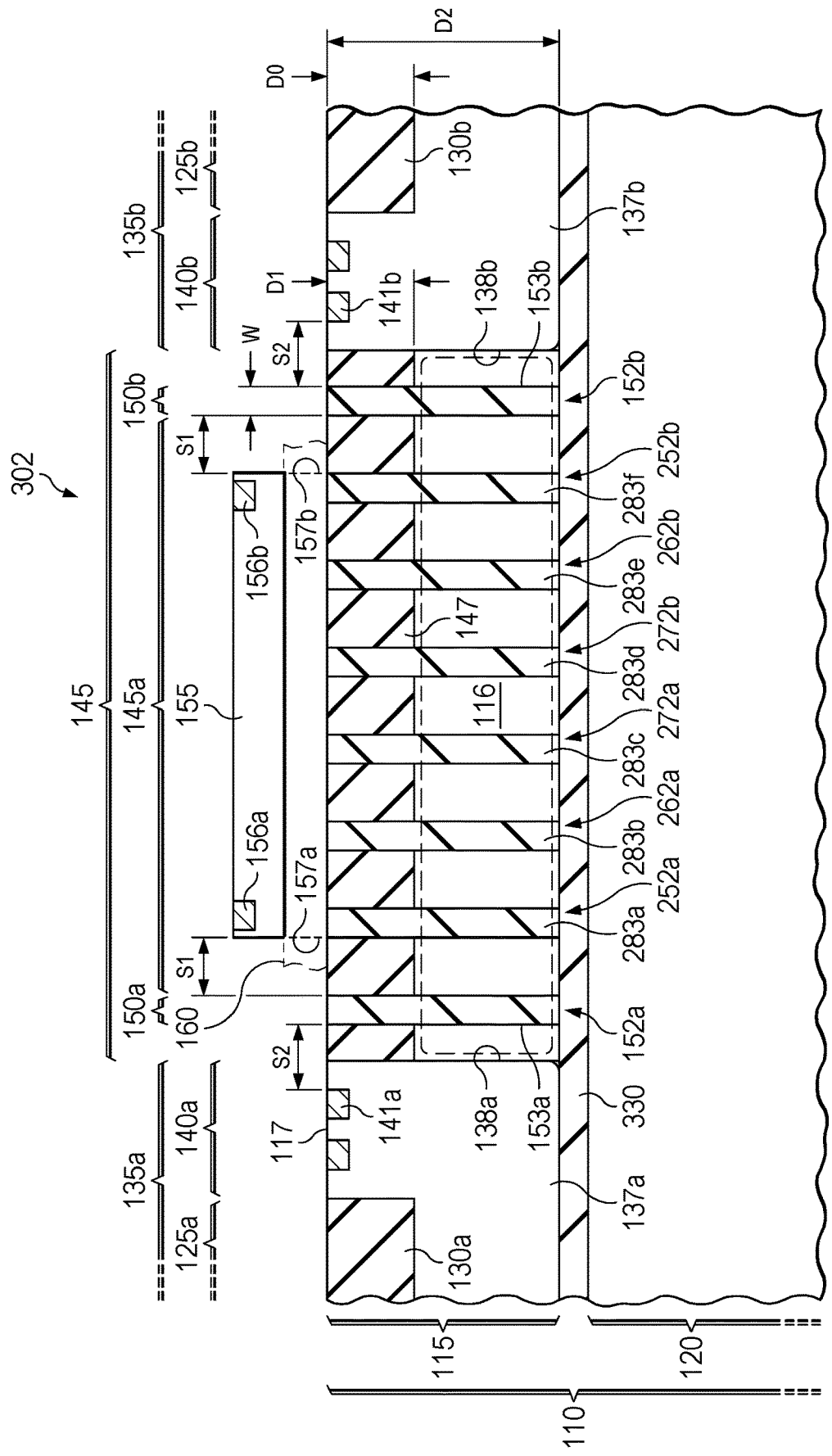

FIGS. 3A and 3B illustrate cross-sectional schematic diagrams of semiconductor devices 301 and 302 in accordance with embodiments of the present disclosure. The semiconductor devices 301 and 302 include a semiconductor substrate having a dielectric layer to improve their high frequency characteristics—e.g., reducing the RF leakage of the IC components 155. The embodiments illustrated in FIGS. 3A and 3B are generally similar to the embodiments illustrated in FIGS. 1A through 2C, and therefore like reference numbers refer to like components or features of FIGS. 1A through 2C.

FIG. 3A illustrates the semiconductor device 301 including a substrate 310. The semiconductor device 301 is generally similar to the semiconductor device 100 described with reference to FIGS. 1A and 1B/1C. In this regard, the semiconductor device 301 may be considered as the semiconductor device 100 formed using the substrate 310. The substrate 310 includes the first semiconductor layer 115, the second semiconductor layer 120, and an oxide layer 330 located between the first and second semiconductor layers 115 and 120. The substrate 310 may be referred to as a silicon-on-insulator (SOI) substrate. The SOI substrate may have the oxide layer 330 with a thickness ranging between 0.1 to 1 μm. The second semiconductor 120 of the SOI substrate may have resistivity greater than 700 Ω-cm. Further, the first semiconductor layer 115 of the SOI substrate may have a thickness ranging between 0.15 to 5 μm. The oxide layer 330 is expected to provide further isolation between the IC component 155 and the second semiconductor layer 120 for the RF signal that the IC component 155 handles, thereby improving the RF leakage characteristics of the IC component 155.

Moreover, the second isolation structures 152a/b extend to (land on, conjoin with, contact) the oxide layer 330 such that the second isolation structures 152a/b are connected to the oxide layer 330. In this manner, part of the lightly doped portion 116 of the first semiconductor layer 115 that corresponds to the inner portion 145a of the first isolation region 145 can be isolated by the dielectric structures—namely, a portion of the first isolation structure 147 corresponding to the inner portion 145a, the oxide layer 330, and the second isolation structures 152a/b. In some embodiments, the thickness of the first semiconductor layer 115 may be less than 0.5 μm. In such embodiments, the second isolation structures 152a/b may be omitted.

FIG. 3B illustrates the semiconductor device 302 including the substrate 310. The semiconductor device 302 is generally similar to the semiconductor devices 201 and 202 described with reference to FIGS. 2A through 2C. In this regard, the semiconductor device 302 may be considered as the semiconductor devices 201 and 202 formed using the substrate 310. As shown in FIG. 3B, each of the second isolation structures 152a/b, 283a-f, 252a/b, 262a/b, 272a/b extends to (lands on, conjoins with, contacts) the oxide layer 330 such that the second isolation structures can be connected to the oxide layer 330. In this manner, part of the lightly doped portion 116 of the first semiconductor layer 115 that corresponds to the inner portion 145a of the first isolation region 145 can be isolated by the dielectric structures—namely, a portion of the first isolation structure 147 corresponding to the inner portion 145a of the first isolation region 145, the oxide layer 330, and the second isolation structures 152a/b. Further, the part of the lightly doped portion 116 is divided into smaller sections, each of which is isolated by the respective dielectric structures.

Figure 4A:
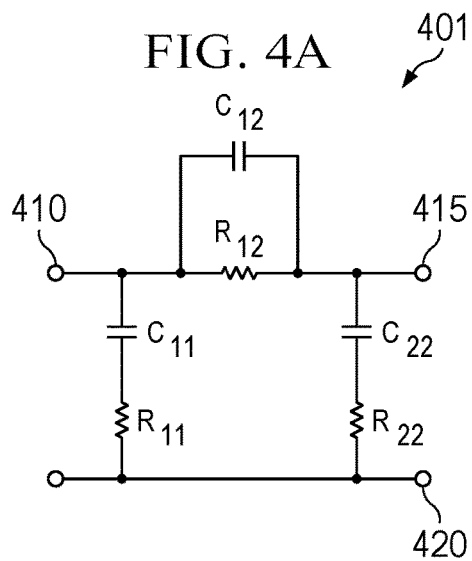
FIGS. 4A through 4D present an equivalent circuit model of a resistor and experimental data illustrating electrical characteristics of the resistor with and without implementation of described embodiments of the present disclosure.

FIGS. 4A through 4D present an equivalent circuit model of a resistor (e.g., an example of the IC component 155) and experimental data illustrating electrical characteristics of the resistor with and without implementing described embodiments of the present disclosure. The experimental data confirm the improved RF leakage characteristics associated with the described embodiments of the present disclosure. FIG. 4A presents an equivalent circuit model 401 of the resistor (e.g., a thin-film resistor, a poly-silicon resistor). The circuit model 401 includes an input node (terminal) 410 and an output node (terminal) 415, which correspond to the contacts 156a and 156b described with reference to FIGS. 1A and 1B/1C, respectively. The circuit model 401 also includes a ground node (terminal) 420 corresponding to the second semiconductor layer 120 described with reference to FIGS. 1A and 1B/1C.

The circuit model 401 includes a resistor R12 and a capacitor C12 representing resistance and capacitance between the input and output nodes 410 and 415 of the resistor, through which the RF signal travels. Moreover, the circuit model 405 includes a resistor R11 and a capacitor C11 representing resistance and capacitance between the resistor and the substrate at or near the input node 410. Similarly, the circuit model 401 includes a resistor R22 and a capacitor C22 representing resistance and capacitance between the resistor and the substrate at or near the output node 415. The resistors R11 and R22 and the capacitors C11 and C22 may be regarded to represent a distributive resistance-capacitance (RC) network between the resistor and the substrate (e.g., the second semiconductor layer 120).

Figure 4B:
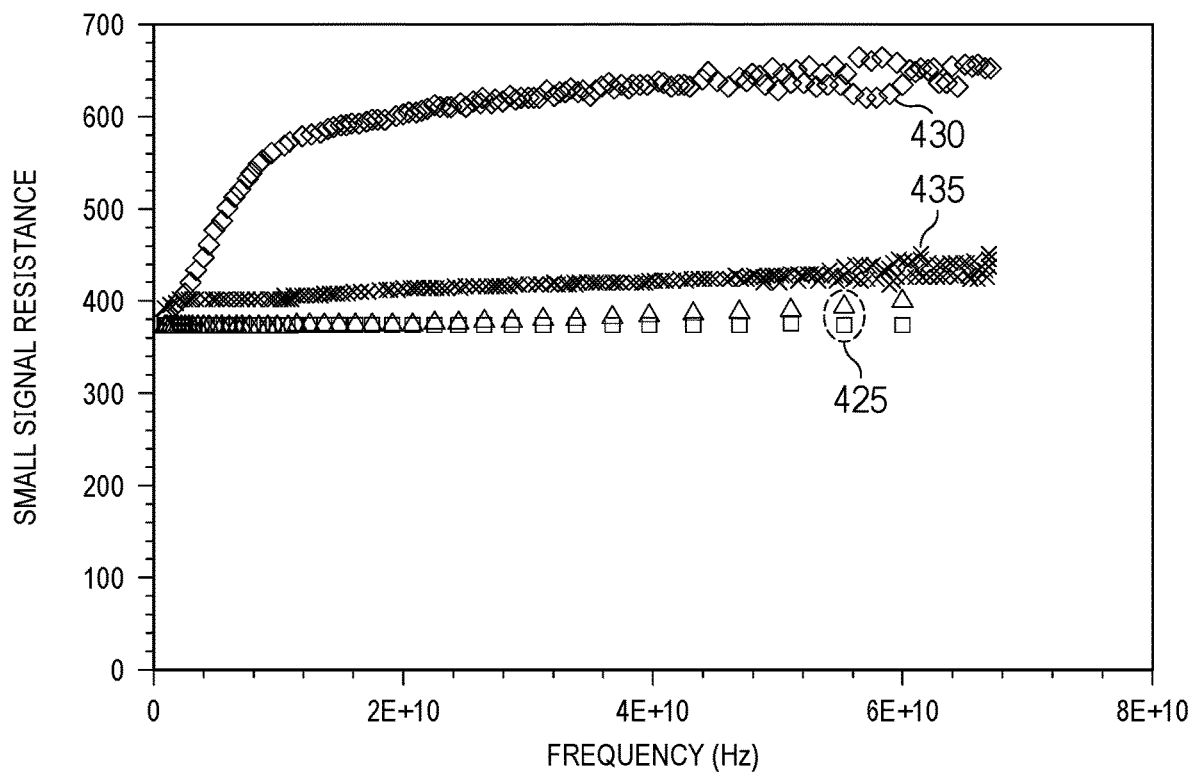

FIG. 4B presents small signal resistance of poly-silicon resistors with respect to operating frequency, namely resistance 425 (triangle and square marks) of ideal poly-silicon resistors, resistance 430 (diamond marks) of a conventional poly-silicon resistor, and resistance 435 ("x" marks) of a poly-silicon resistor with described embodiments of the present disclosure (e.g., the semiconductor devices 100, 201, 202, 301, or 302). Ideal poly-silicon resistors may include a first-order schematic model of the resistor based on its physical dimensions (e.g., lengths, widths) or a layout-based model incorporating effects of other structures surrounding the resistor. Such resistor models do not reflect the effect of the substrate as a function of operating frequency. Accordingly, the resistance 425 does not show significant dependency on the operating frequency as shown in FIG. 4B.

The conventional poly-silicon resistor is a poly-silicon resistor formed in a field region (e.g., the region including field oxide and well implants). The conventional poly-silicon resistor is expected to have significant RF leakage and its high frequency behavior significantly deviates from its DC or low-frequency behavior. For example, at or 4 GHz, the small signal resistance of the conventional poly-silicon resistor is about 450Ω or higher when compared to its DC value of about 380Ω. The small signal resistance further increases to about 600Ω at 20 GHz or higher.

The poly-silicon resistor implementing described embodiments of the present disclosure is a poly-silicon resistor formed over the first isolation region (e.g., the STI region 145). A lightly doped portion of an epi-layer (e.g., the lightly doped portion 116) is located under the first isolation region. Further, the second isolation structure (e.g., the DTI structures 153) surrounds the footprint of the poly-silicon resistor as described with reference to FIGS. 1A and 1B/1C. The poly-silicon resistor in accordance with embodiments of the present disclosure, in comparison to the conventional poly-silicon resistor, exhibits reduced RF leakage and its high frequency behavior remains reasonably close to its DC or low-frequency behavior. For example, at or 4 GHz, the small signal resistance of the resistor slightly increases to about 400Ω (from about 380Ω). The small signal resistance remains around 420Ω at 20 GHz.

The improved high frequency behavior of the poly-silicon resistor in accordance with embodiments of the present disclosure can be explained by the behavior of substrate capacitance (which may also be referred to as shunt capacitance) and/or substrate resistance (which may also be referred to as shunt resistance). The substrate capacitance and resistance behavior may be considered as characteristics of the distributive RC network including the resistors R11 and R22 and the capacitors C11 and C22.

Figure 4C:
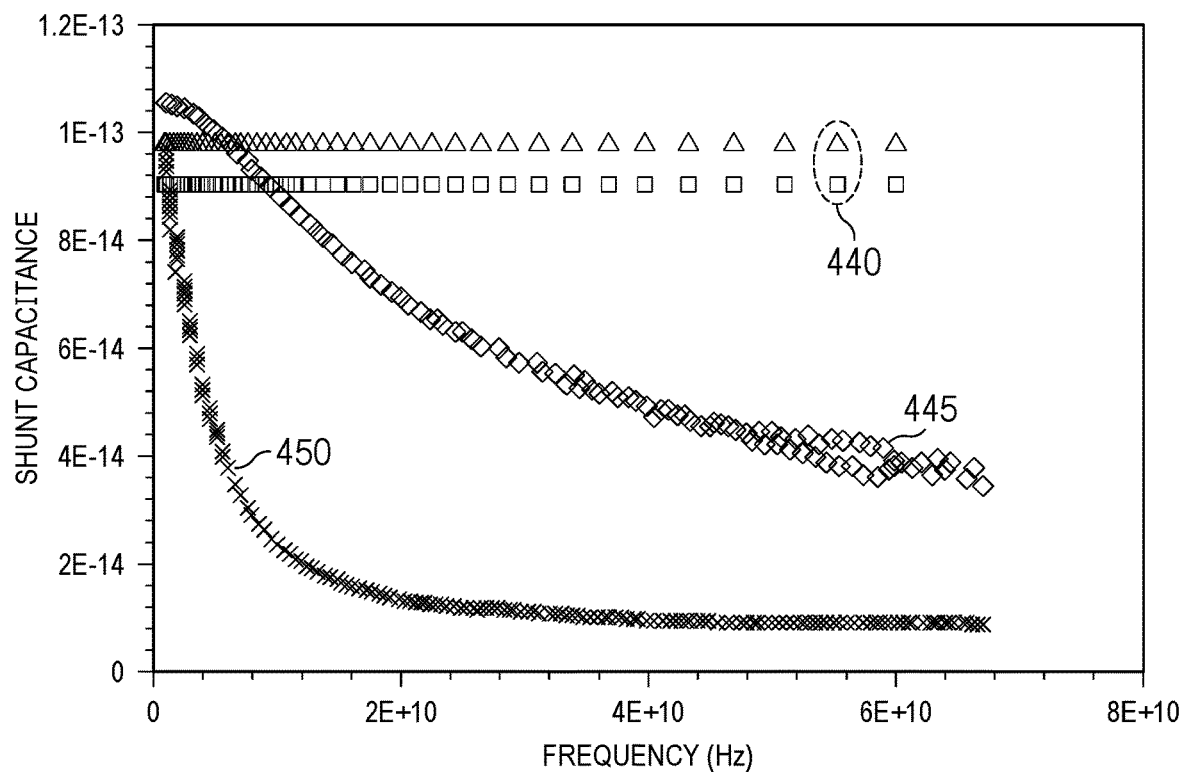

FIG. 4C presents substrate capacitance associated with the poly-silicon resistors with respect to operating frequency, namely substrate capacitance 440 (triangle and square marks) for the ideal poly-silicon resistors, substrate capacitance 445 (diamond marks) for the conventional poly-silicon resistor, and substrate capacitance 450 ("x" marks) for the poly-silicon resistor with described embodiments of the present disclosure. As shown in FIG. 4C, the substrate capacitance 450 is less than the substrate capacitance 445 across the range of operating frequency. The substrate capacitance 440 is independent of the operating frequency as the ideal models do not reflect the substrate effect.

Figure 4D:
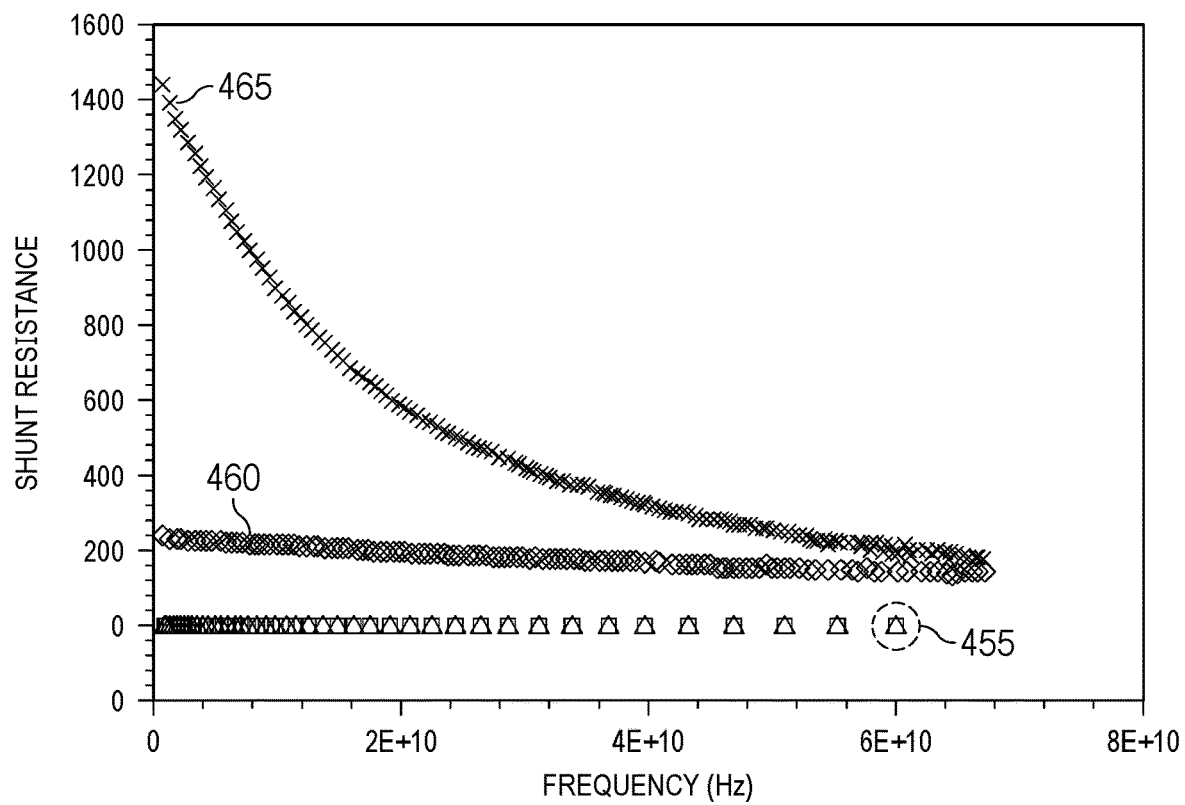

FIG. 4D presents substrate resistance associated with the poly-silicon resistors with respect to operating frequency, namely substrate resistance 455 (triangle and square marks) for the ideal poly-silicon resistors, substrate resistance 460 (diamond marks) for the conventional poly-silicon resistor, and substrate resistance 465 ("x" marks) for the poly-silicon resistor in accordance with embodiments of the present disclosure. As shown in FIG. 4D, the substrate resistance 465 is greater than the substrate resistance 460 across the range of operating frequency. The substrate resistance 455 is independent of the operating frequency as the ideal models do not reflect the substrate effect.

Consequently, the improved high frequency characteristics of the poly-silicon resistor in accordance with embodiments of the present disclosure can be attributed to the increased resistance and decreased capacitance of the substrate, which render coupling of the RF signal to the substrate more difficult. In other words, more RF signal stays within the poly-silicon resistor (e.g., the IC component 155) during the high frequency operation at least partially due to the less RF leakage to the substrate (e.g., the second semiconductor layer 120).

Figure 5A:
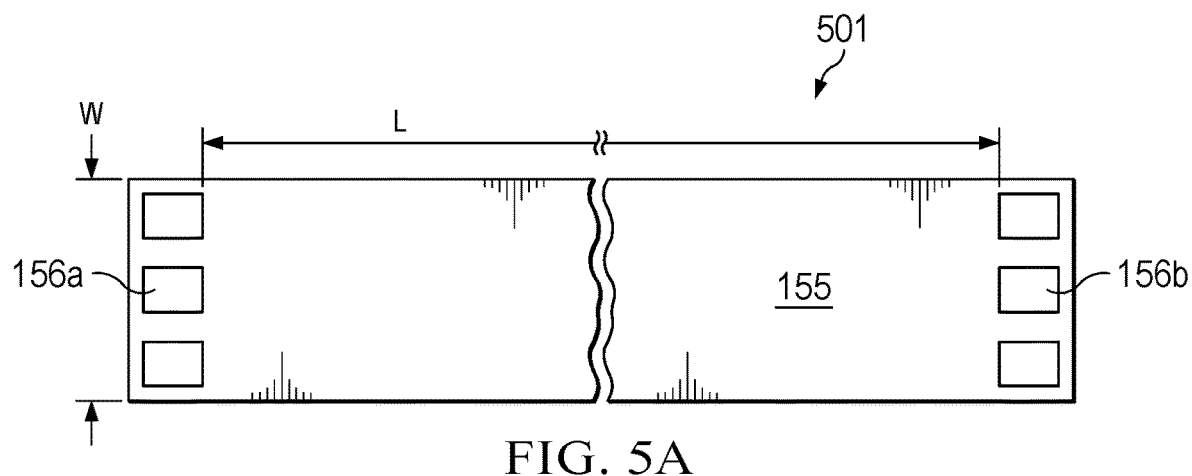
FIGS. 5A and 5B illustrate examples of resistors in accordance with embodiments of the present disclosure.
Figure 5B:
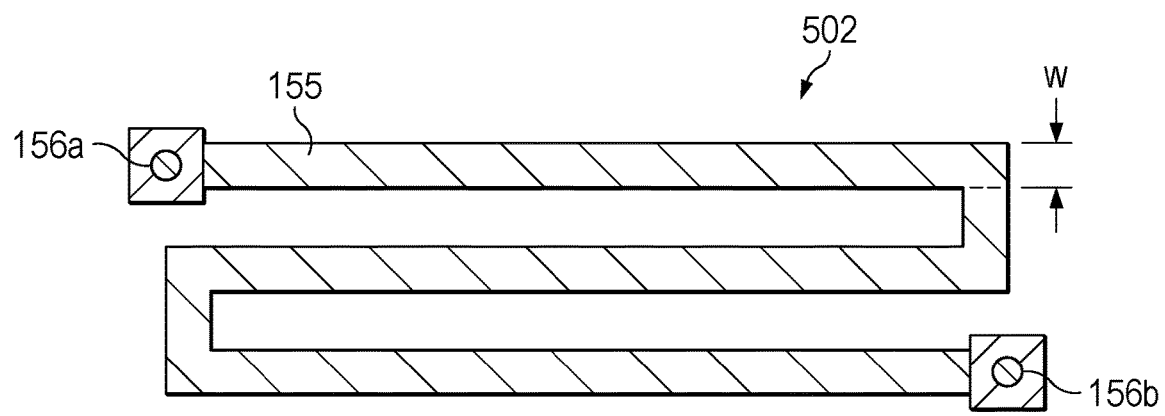

FIGS. 5A and 5B illustrate examples of resistors in accordance with embodiments of the present disclosure. The IC component 155 described with reference to FIGS. 1A and 1B/1C may include a resistor 501 or 502 depicted in FIGS. 5A/5B. As described herein, the resistor 501 (or 502) can be formed with poly-silicon (i.e., a poly-silicon resistor). The poly-silicon may be the same poly-silicon used to form gate structures of MOSFETs or to form emitter or base structures of BJTs. The poly-silicon resistor may have a thickness ranging between 0.1 to 0.5 µm. The poly-silicon resistor may have a width (W as denoted in FIGS. 5A/5B) in accordance with the design rules directed to gate lengths of MOSFETs for a given technology node. For example, the width of the poly-silicon resistor may be equal to or greater than 0.18 µm. The poly-silicon resistor may have any length (L as denoted in FIG. 5A) to obtain specific resistance values—e.g., several hundred microns. In some cases, the poly-silicon resistor has a serpentine shape as in the resistor 502. In some cases, the length is greater than at least 0.5 µm.

Moreover, the poly-silicon can be modified to obtain specific resistance values. For example, n-type and/or p-type dopant atoms can be introduced to the poly-silicon to obtain a sheet resistance of about 200Ω/□. Additionally, or alternatively, a conductive layer may be formed on the poly-silicon, such as tungsten (W), tungsten silicide (WSix), titanium silicide (TiSix), or nickel silicide (NiSix). As a result of forming the conductive layer, the sheet resistance of less than 10Ω/□ can be achieved. In some embodiments, the resistor 501 (or 502) can be formed with a thin film resistor material, such as tantalum nitride (TaN), silicon chromium (SiCr), or nickel chromium (NiCr). In other embodiments, the resistor 501 (or 502) can be formed with aluminum or copper. Additionally, overall physical and electrical considerations for the resistor 501 (or 502) can include electromigration characteristics of the materials in view of relatively large current density that the high-frequency operations typically support.

Figure 6A:
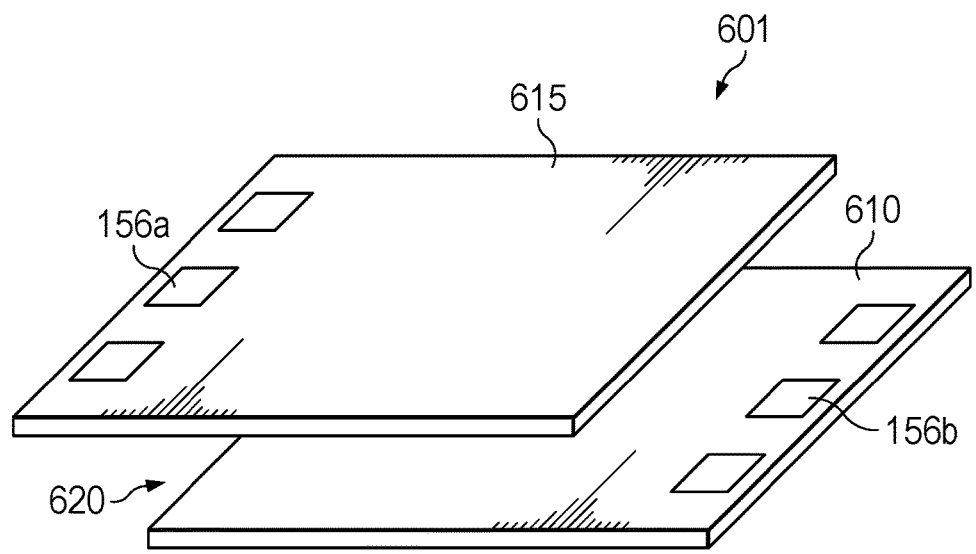
FIGS. 6A and 6B illustrate examples of capacitors in accordance with embodiments of the present disclosure.
Figure 6B:
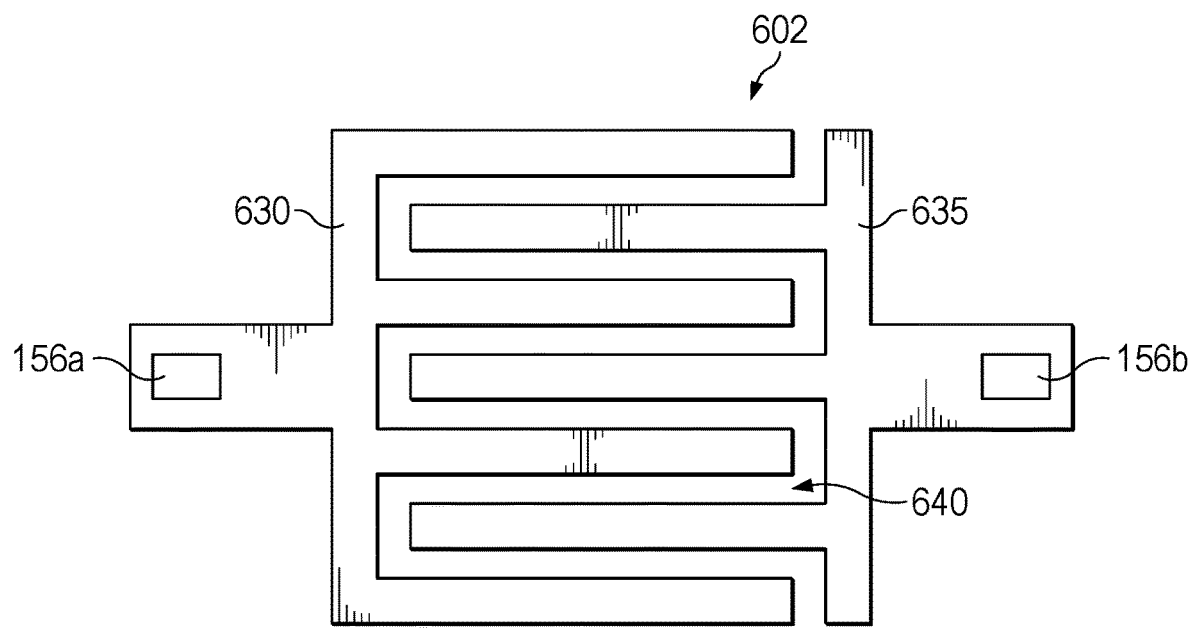

FIGS. 6A and 6B illustrate examples of capacitors in accordance with embodiments of the present disclosure. The IC component 155 described with reference to FIGS. 1A and 1B/1C may include a capacitor 601 (or 602) depicted in FIGS. 6A/6B. The capacitor 601 can be formed from a stack of materials (e.g., materials vertically stacked on top of another), which construct a first conductive plate 610, a second conductive plate 615, and a dielectric layer 620 between the first and second conductive plates 610 and 615. The conductive materials for the first and second conductive plates 610 and 615 may include poly-silicon, titanium nitride (TiN), aluminum, copper, or the like. For example, the first conductive plate 610 is a poly-silicon electrode and the second conductive plate 615 is a TiN electrode. In other examples, both the first and second conductive plates 610 and 615 are made of poly-silicon. In yet other examples, both the first and second conductive plates 610 and 615 are made of aluminum (or copper).

The capacitor 602 can be formed from different materials within the same layer, which construct a first conductive plate 630, a second conductive plate 635, and a dielectric layer 640 between the first and second conductive plates 630 and 635—e.g., interdigitated metal lines separated by a dielectric material. As such, the capacitor 602 may be referred to as a planar capacitor. Various conductive materials described above with reference to the capacitor 601 may be used for the first and second conductive plates 630 and 635. Moreover, the capacitors 602 (or 601) can be stacked on top of another (e.g., over multiple layers of metallization structures) to increase the capacitance value.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A semiconductor device, comprising:
a semiconductor layer over a substrate, the semiconductor layer including a surface opposite to the substrate;
a well structure within the semiconductor layer, the well structure including first and second well portions laterally spaced apart from each other along the surface;
a shallow trench isolation (STI) structure located between the first and second well portions, the STI structure extended to a first depth with respect to the surface;
a component over the STI structure, the component having a footprint between the first and second well portions, wherein:
a first edge of the footprint faces the first well portion; and
a second edge of the footprint faces the second well portion; and
a deep trench isolation (DTI) structure located between the first and second well portions, the DTI structure extended to a second depth with respect to the surface, the second depth being greater than the first depth, wherein:
a first portion of the DTI structure is located between the first edge of the footprint and the first well portion; and
a second portion of the DTI structure is located between the second edge of the footprint and the second well portion.

2. The semiconductor device of claim 1, further comprising one or more contacts located in the well structure, the one or more contacts being electrically coupled with the substrate through the well structure.

3. The semiconductor device of claim 1, wherein the semiconductor layer located between the first and second well portions comprises a lightly doped portion of the semiconductor layer.

4. The semiconductor device of claim 1, wherein the semiconductor layer located between the first and second portions of the DTI structure comprises a lightly doped portion of the semiconductor layer.

5. The semiconductor device of claim 1, wherein:
the first depth is less than one (1) micron; and
the second depth is greater than one (1) micron and less than twenty (20) microns.

6. The semiconductor device of claim 1, further comprising one or more additional DTI structures located within the footprint of the component.

7. The semiconductor device of claim 1, wherein the component comprises a resistor that is located directly on the STI structure, and comprises polycrystalline silicon.

8. The semiconductor device of claim 1, further comprising a dielectric layer disposed on the STI structure, wherein the component is a resistor that is located directly on the dielectric layer.

9. The semiconductor device of claim 1, wherein the component comprises a resistor that comprises at least one of polycrystalline silicon, tungsten silicide, titanium silicide, nickel silicide, tungsten, aluminum, copper, tantalum nitride, silicon chromium, or nickel chromium.

10. The semiconductor device of claim 1, further comprising a dielectric layer located between the semiconductor layer and the substrate, wherein the DTI structure contacts the dielectric layer.

11. The semiconductor device of claim 1, wherein:
the semiconductor layer has a first dopant concentration; and
the well structure has a second dopant concentration greater than the first dopant concentration.

12. The semiconductor device of claim 1, wherein the semiconductor layer, the well structure, and the substrate have a first conductivity type.

13. A semiconductor device, comprising:
a shallow trench isolation (STI) region of a semiconductor layer, the STI region including a deep trench isolation (DTI) region, wherein:
the STI region includes an inner portion inside the DTI region;
the STI region includes a first dielectric isolation structure with a first thickness with respect to a surface of the semiconductor layer; and
the DTI region includes a second dielectric isolation structure with a second thickness with respect to the surface greater than the first thickness;
a well region of the semiconductor layer surrounding the STI region, the well region having a greater dopant concentration than the semiconductor layer; and a component having a footprint located within the inner portion of the STI region.

14. The semiconductor device of claim 13, wherein:
the first thickness of the first dielectric isolation structure is less than one (1) micron; and
the second thickness of the second dielectric isolation structure is greater than one (1) micron and less than twenty (20) microns.

15. The semiconductor device of claim 13, wherein the semiconductor layer surrounded by the well region comprises a lightly doped portion of the semiconductor layer.

16. The semiconductor device of claim 13, wherein the semiconductor layer is located over a substrate that has a greater dopant concentration than the well region.

17. The semiconductor device of claim 13, further comprising one or more contacts located in the well region, the one or more contacts being electrically coupled with a substrate located beneath the semiconductor layer through the well region.

18. The semiconductor device of claim 13, wherein the component comprises a resistor that is located directly on the STI region, and includes polycrystalline silicon.

19. The semiconductor device of claim 13, wherein the DTI region corresponds to the outermost one of a plurality of DTI regions of the semiconductor layer, and wherein the DTI regions of the plurality form a series of concentric closed loops.

20. The semiconductor device of claim 19, wherein the footprint of the component at least partially overlaps one or more of the DTI regions of the plurality.

21. The semiconductor device of claim 13, wherein the DTI region corresponds to the outermost rim of a DTI mesh formed by a plurality of DTI segments intersecting with each other.

22. The semiconductor device of claim 21, wherein the footprint of the component at least partially overlaps the DTI mesh.

23. A semiconductor device, comprising:
a first semiconductor layer over a second semiconductor layer, the first semiconductor layer having a surface facing away from the second semiconductor layer;
a doped structure within the first semiconductor layer, the doped structure including first and second doped portions that are laterally spaced apart from each other along the surface;
a first isolation structure located between the first and second doped portions, the first isolation structure extended to a first depth from the surface; and
an integrated circuit (IC) component over the first isolation structure, the IC component having a footprint between the first and second doped portions.

24. The semiconductor device of claim 23, wherein the first semiconductor layer underneath the first isolation structure and located between the first and second doped portions comprises a lightly doped portion of the first semiconductor layer.

25. The semiconductor device of claim 24, wherein the lightly doped portion of the first semiconductor layer comprises first dopant atoms of a first conductivity type and second dopant atoms of a second conductivity type.

26. The semiconductor device of claim 24, wherein the lightly doped portion of the first semiconductor layer has a sheet resistance greater than ten-thousands (10,000) ohms/square.

27. The semiconductor device of claim 23, further comprising one or more contacts located in the doped structure, the one or more contacts being electrically coupled with the second semiconductor layer through the doped structure.

28. The semiconductor device of claim 23, wherein the IC component is located directly on the first isolation structure.

29. The semiconductor device of claim 23, further comprising a dielectric layer disposed on the first isolation structure, wherein the IC component is located directly on the dielectric layer.

30. The semiconductor device of claim 23, wherein the IC component comprises:
a resistor, a capacitor, a thin-film transistor, or a combination thereof, wherein the resistor includes at least one of polycrystalline silicon, tungsten silicide, titanium silicide, nickel silicide, tungsten, aluminum, copper, tantalum nitride (TaN), silicon chromium (SiCr), or nickel chromium (NiCr).

31. The semiconductor device of claim 23, wherein:
the first semiconductor layer comprises an epitaxial layer; and
the doped structure comprises a well structure.

32. The semiconductor device of claim 23, wherein the first semiconductor layer, the second semiconductor layer, and the doped structure have a first conductivity type.

33. The semiconductor device of claim 23, wherein:
the first semiconductor layer has first resistivity;
the second semiconductor layer has second resistivity less than the first resistivity; and
the doped structure has third resistivity less than the first resistivity and greater than the second resistivity.

34. The semiconductor device of claim 23, further comprising:
a second isolation structure located between the first and second doped portions, the second isolation structure extended to a second depth from the surface greater than the first depth, wherein:
a first portion of the second isolation structure is located between a first edge of the footprint and the first doped portion; and
a second portion of the second isolation structure is located between a second edge of the footprint and the second doped portion.

35. The semiconductor device of claim 34, wherein the first semiconductor layer underneath the first isolation structure and located between the first and second portions of the second isolation structure comprises a lightly doped portion of the first semiconductor layer.

36. The semiconductor device of claim 34, further comprising one or more contacts located in the doped structure, the one or more contacts being electrically coupled with the second semiconductor layer through the doped structure, wherein a distance between the first portion of the second isolation structure and the nearest contact of the one or more contacts thereto is less than fifty (50) microns.

37. The semiconductor device of claim 34, further comprising one or more additional second isolation structures located between the first and second edges of the footprint of the IC component.

38. The semiconductor device of claim 34, wherein a distance between the first edge of the footprint and the first portion of the second isolation structure ranges between one (1) to ten (10) microns.

39. The semiconductor device of claim 34, further comprising a dielectric layer located between the first semiconductor layer and the second semiconductor layer, wherein the second isolation structure contacts the dielectric layer.

40. The semiconductor device of claim 34, wherein:
the first isolation structure comprises a shallow trench isolation (STI) structure or a local oxidation of silicon (LOCOS) structure; and
the second isolation structure comprises a deep trench isolation (DTI) structure.

41. The semiconductor device of claim 34, wherein:
the first depth is less than one (1) micron; and
the second depth is greater than one (1) micron and less than twenty (20) microns.

* * * * *